United States Patent
Yamada et al.

(10) Patent No.: US 11,067,250 B2
(45) Date of Patent: Jul. 20, 2021

(54) LIGHT EMITTING DEVICE AND INTEGRATED LIGHT EMITTING DEVICE

(71) Applicant: NICHIA CORPORATION, Anan (JP)

(72) Inventors: Yuichi Yamada, Anan (JP); Motokazu Yamada, Tokushima (JP)

(73) Assignee: NICHIA CORPORATION, Anan (JP)

( * ) Notice: Subject to any disclaimer, the term of this patent is extended or adjusted under 35 U.S.C. 154(b) by 286 days.

(21) Appl. No.: 15/855,573

(22) Filed: Dec. 27, 2017

(65) Prior Publication Data
US 2018/0180250 A1    Jun. 28, 2018

(30) Foreign Application Priority Data

Dec. 28, 2016    (JP) .............................. JP2016-255285

(51) Int. Cl.
*F21V 7/00*         (2006.01)
*F21K 9/64*         (2016.01)
(Continued)

(52) U.S. Cl.
CPC .............. *F21V 7/0083* (2013.01); *F21K 9/64* (2016.08); *F21V 9/30* (2018.02); *F21V 17/002* (2013.01);
(Continued)

(58) Field of Classification Search
CPC . H01L 2224/48091; H01L 2924/00014; H01L 2924/00; H01L 2924/181; H01L 33/60; H01L 2224/45144; H01L 33/54; H01L 2924/00012; H01L 2224/49175; H01L 25/0753; H01L 33/46; H01L 33/56; H01L 33/58; H01L 2224/48227;
(Continued)

(56) References Cited

U.S. PATENT DOCUMENTS

| 2007/0138494 A1 | 6/2007 | Pugh et al. |
| 2007/0284600 A1 | 12/2007 | Shchekin et al. |

(Continued)

FOREIGN PATENT DOCUMENTS

| EP | 3 154 096 A1 | 4/2017 |
| JP | 2004-207519 A | 7/2004 |

(Continued)

*Primary Examiner* — Thien M Le
*Assistant Examiner* — Tae W Kim
(74) *Attorney, Agent, or Firm* — Foley & Lardner LLP

(57) ABSTRACT

A light emitting device includes: a base; a light emitting element; a light reflective film located on an upper surface of the light emitting element; and a encapsulant. A ratio of a maximum width ($W_{max}$) of the encapsulant with respect to a maximum width of the light emitting element, in a side view, is 2 or more. An outer shape of a part of the encapsulant located within a range of elevation angles that is in a range of 10° to 50° from a center of a mounting region at an upper surface of the base on which the light emitting element is mounted is formed to have a curved surface. A ratio ($r/W_{max}$) of a radius of curvature (r) of the curved surface with respect to the maximum width ($W_{max}$) of the encapsulant, in a side view, is in a range of 0.25 to 0.50.

16 Claims, 3 Drawing Sheets

(51) Int. Cl.
*H01L 33/46* (2010.01)
*H01L 33/48* (2010.01)
*H01L 25/075* (2006.01)
*H01L 33/50* (2010.01)
*H01L 33/60* (2010.01)
*H01L 33/62* (2010.01)
*H01L 33/54* (2010.01)
*F21V 9/30* (2018.01)
*F21V 17/00* (2006.01)
*F21V 3/00* (2015.01)
*F21V 3/02* (2006.01)
*F21Y 115/10* (2016.01)
*F21Y 105/16* (2016.01)
*F21V 13/12* (2006.01)

(52) U.S. Cl.
CPC .......... *H01L 25/0753* (2013.01); *H01L 33/46* (2013.01); *H01L 33/486* (2013.01); *H01L 33/502* (2013.01); *H01L 33/507* (2013.01); *H01L 33/54* (2013.01); *H01L 33/60* (2013.01); *H01L 33/62* (2013.01); *F21V 3/00* (2013.01); *F21V 3/02* (2013.01); *F21V 13/12* (2013.01); *F21Y 2105/16* (2016.08); *F21Y 2115/10* (2016.08)

(58) Field of Classification Search
CPC ......... H01L 2224/48247; H01L 33/505; H01L 33/507; H01L 2224/16225; H01L 2224/45139; H01L 2224/73265; H01L 2924/3025; H01L 33/508; H01L 33/62; H01L 2224/45099; H01L 2924/1815; H01L 33/486; H01L 33/50; F21Y 2115/10; G02F 1/133603; G02F 1/133605; G02F 1/133611; G02F 2001/133607; G02F 2001/133612
USPC .......................................................... 362/84
See application file for complete search history.

(56) References Cited

U.S. PATENT DOCUMENTS

| | | |
|---|---|---|
| 2008/0006838 A1 | 1/2008 | Hattori et al. |
| 2008/0308824 A1 | 12/2008 | Shchekin et al. |
| 2008/0315228 A1 | 12/2008 | Krames et al. |
| 2009/0045416 A1 | 2/2009 | Bierhuizen et al. |
| 2012/0044669 A1* | 2/2012 | Ogata ............... F21K 9/90 362/97.3 |
| 2013/0270587 A1* | 10/2013 | Ouderkirk ............ H01L 33/60 257/89 |
| 2014/0092584 A1 | 4/2014 | Ono et al. |
| 2015/0049510 A1 | 2/2015 | Haiberger et al. |
| 2015/0129902 A1 | 5/2015 | Iino |
| 2016/0293813 A1* | 10/2016 | Aruga ............... H01L 33/58 |

FOREIGN PATENT DOCUMENTS

| | | | |
|---|---|---|---|
| JP | 2007-173849 A | 7/2007 | |
| JP | 2008-004948 A | 1/2008 | |
| JP | 2008-016556 A | 1/2008 | |
| JP | 2010-530082 A | 9/2010 | |
| JP | 2010-537400 A | 12/2010 | |
| JP | 2013-016813 A | 1/2013 | |
| JP | 2015-512157 A | 4/2015 | |
| JP | 2015-095488 A | 5/2015 | |
| KR | 20150048578 A * | 5/2015 | ....... G02F 1/133603 |
| WO | WO-2015/112680 A1 | 7/2015 | |

* cited by examiner

LIGHT EMITTING DEVICE AND INTEGRATED LIGHT EMITTING DEVICE

CROSS-REFERENCE TO RELATED APPLICATION

This application claims priority to Japanese Patent Application No. 2016-255285, filed on Dec. 28, 2016, the disclosure of which is hereby incorporated by reference in its entirety.

BACKGROUND

The present disclosure relates to light emitting devices, integrated light emitting devices, and light emitting modules.

In recent years, various electronic components have been proposed and put into practical use. Such devices are increasingly required to exhibit higher performance. In particular, some electronic components need to maintain their performance for a long period of time under a strict usage environment. Such requirements can apply to light emitting devices using semiconductor light emitting elements, including a light emitting diode (LED). That is, in the fields of general lighting and vehicle-mounted lighting, light emitting devices have been increasingly required to demonstrate higher performance, specifically, higher output (i.e., higher luminance) and higher reliability. Furthermore, light emitting devices are expected to be supplied at low costs while maintaining high performance.

Backlights used in liquid crystal televisions, general lighting devices, and the like are developed by focusing on their designs, which leads to a high demand for thinning.

For example, Japanese Unexamined Patent Application Publication No. 2008-4948 discloses a light emitting device incorporating a reflector which is provided on the upper surface of a light emitting element flip-chip mounted on a submount to, thereby achieve thinning of the backlight.

Japanese Patent Publication No. 2008-4948 can achieve a light emitting device with wide light distribution. However, with further thinning of the backlight, a thinned light emitting device with wider light distribution has been required.

SUMMARY

Certain embodiments of the present disclosure have been made in view of the foregoing circumstances. Therefore, it is an object of certain embodiments of the present disclosure to provide a thinned light emitting device with wider light distribution.

In one embodiment, a light emitting device includes: a base comprising a conductive wiring; a light emitting element mounted on the base, and including an active layer adopted to emit a first light; a light reflective film located on an upper surface of the light emitting element; and a encapsulant covering the light emitting element and the light reflective film. A ratio of a maximum width ($W_{max}$) of the encapsulant with respect to a maximum width of the light emitting element in a side view is 2 or more. An outer shape of a part of the encapsulant located within a range of elevation angles that is in a range of 10° to 50° from a center of a mounting region at an upper surface of the base on which the light emitting element is formed to have a curved surface. A ratio ($r/W_{max}$) of a radius of curvature (r) of the curved surface with respect to the maximum width ($W_{max}$) of the encapsulant, in a side view, is in a range of 0.25 to 0.50.

Accordingly, certain embodiments of the present invention can provide a thinned light emitting device with wide light distribution.

DETAILED DESCRIPTION

Figure 1:
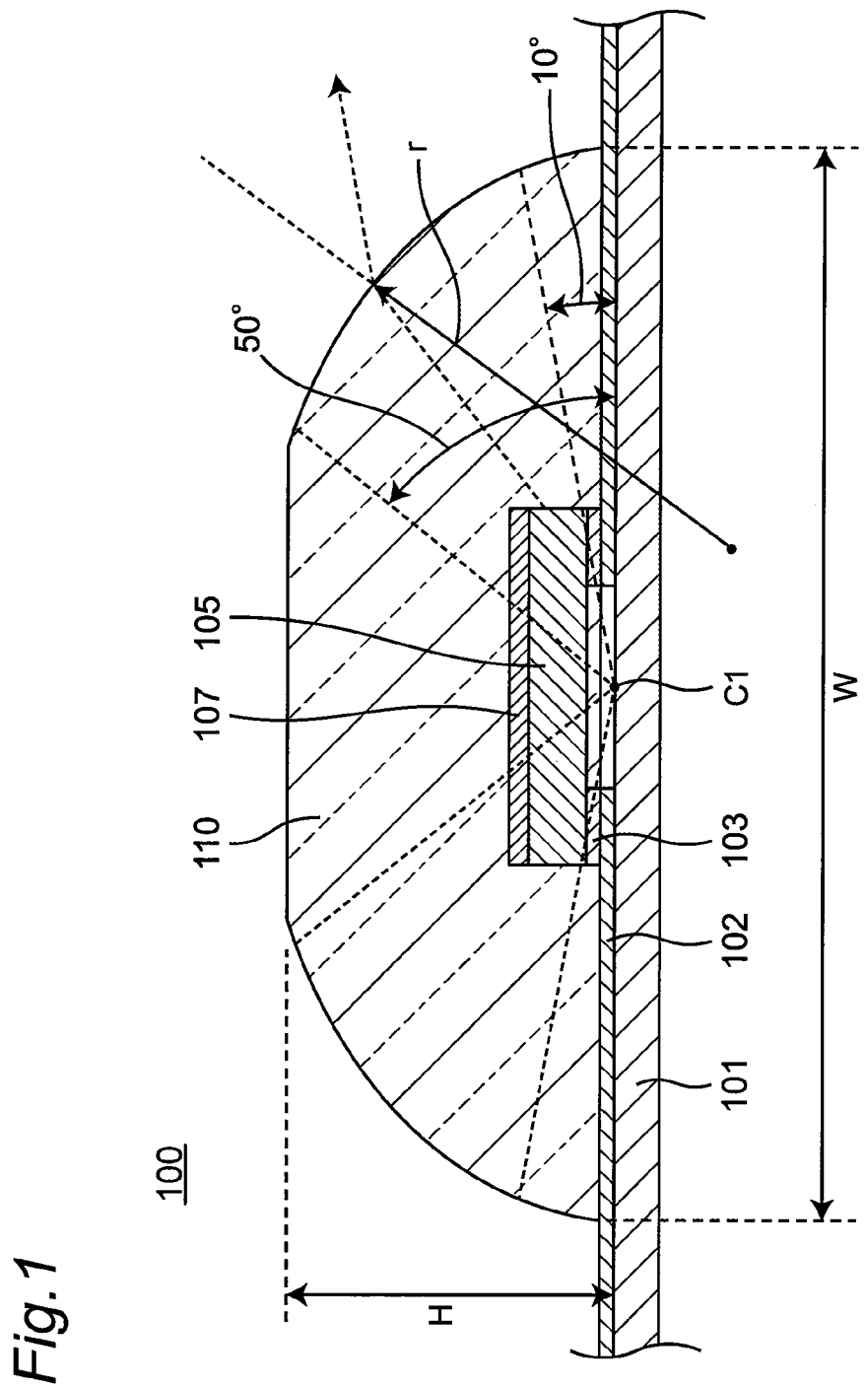
FIG. 1 is a cross-sectional view showing an example of a light emitting device according to a first embodiment.

Embodiments of the present invention will be described below with reference to the accompanying drawings as appropriate. It is noted that, while certain embodiments are described below, the present invention is not limited to the described embodiments, unless otherwise specified. The contents of the description regarding one embodiment or example can also be applied to other embodiments and examples.

Furthermore, in the description below, the same names or reference numerals denote the same or similar members, and thus a detailed description thereof will be omitted as appropriate. Moreover, elements described below as being made up of a plurality of members may be formed by a single member, thereby allowing the single member to function as the plurality of elements. Conversely, the function of one member can be shared and achieved by a plurality of members.

First Embodiment

FIG. 1 is a schematic cross-sectional view showing the configuration of a light emitting device 100 according to a first embodiment.

As shown in FIG. 1, in this embodiment, the light emitting device includes a base 101 with conductive wirings 102 on its surface, and a light emitting element 105 mounted on the base 101. The light emitting element 105 is flip-chip mounted via bonding members 103 to straddle at least a region between a pair of conductive wirings 102 provided on the surface of the base 101. A light reflective film 107 is formed on a light extraction surface side of the light emitting element 105 (i.e., upper surface of the light emitting element 105). The light reflective film 107 is provided at the substantially entire upper surface of the light emitting element 105. The light emitting device 100 according to the first embodiment includes a light transmissive encapsulant 110 that covers the light emitting element 105 and the light reflective film 107. Here, the encapsulant 110 is disposed preferably such that a central axis of the encapsulant 110 is aligned with a central axis of the light emitting element 105. Over the conductive wirings 102, an insulting member may be provided excluding at least an area where at least the light emitting element 105 is electrically connected.

The light reflective film 107 reflects, for example, 70% or more of the whole light emitted from the light emitting element 105. Thus, much of the light oriented in a direction perpendicular to the base 101 (i.e., light emitted from the upper surface of the light emitting element 105) of the light emitted from the light emitting element 105 (also hereinafter referred to as a first light) are reflected by the light reflective film 107, resulting in an increase in the amount reflected light, oriented in the horizontal direction relative to the base 101. The light emitting device 100 according to the first embodiment includes the light reflective film 107, thereby achieving batwing light distribution characteristics.

The term "batwing light distribution characteristics" as used herein refers to the light distribution characteristics exhibiting: a first peak in a first region having a light distribution angle of less than 90°, the first peak having a higher intensity than that at the light distribution angle of 90°; and a second peak in a second region having a light distribution angle of more than 90°, the second peak having a higher intensity than that at the light distribution angle of 90°.

The light emitting element 105 and the light reflective film 107 are covered with the encapsulant 110 having light transmissivity. The encapsulant 110 is a member disposed over the base to cover the light emitting element 105 in order to protect the light emitting element 105 from an external environment and to optically control the light output from the light emitting element 105. The encapsulant 110 is formed in a shape to be described in detail later and achieves wide light distribution characteristics together with the light reflective film 107 in the light emitting device of the present embodiment.

The encapsulant 110 is preferably formed to have a circular or ellipsoidal outer shape in the top view, or a substantially quadrilateral outer shape with semicircular corners in the top view. The encapsulant 110 is formed such that a ratio of a height (H) of the encapsulant in an optical-axis direction to a diameter (i.e., shortest width: $W_{min}$) of the encapsulant in the top view is set at less than 0.5, and more preferably less than 0.3. For the ellipsoidal shape, there are a major axis and a minor axis that can be considered as the length of the width, but in the present specification, the shortest width $W_{min}$ is defined as the minor axis. The term "substantially quadrilateral shape" includes a substantially square shape with four respective corners in the semicircular shape, and a substantially rectangular shape with four respective corners in the semicircular shape. When the encapsulant 110 has a substantially square shape in the top view, the length of one side of the square shape is defined as the shortest width $W_{min}$. When the encapsulant 110 has a substantially rectangle shape in the top view, the length of a short side of the rectangle shape is defined as the shortest width $W_{min}$.

The height (H) of the encapsulant refers to the height from a mounting surface for the light emitting element 105, in other words, from the surface of the base 101.

In the light emitting device 100 of the first embodiment, in order to allow the light emitted from the light emitting element 105 to be emitted therefrom with wider light distribution angle, at least a part of the surface of the encapsulant 110 is formed to have a curved surface, and the entire surface of the encapsulant has a protrusion shape as a whole.

Specifically, in order to allow light emitted from the light emitting element 105 with wider light distribution angle to travel out from the light emitting device 100, the outer shape of at least a part of the encapsulant located within a range of elevation angles of 10° to 50° from a center C1 of a mounting region at the upper surface of the base 101 is formed to have the curved surface. Here, for example, when the planar shape of the light emitting element 105 is quadrilateral, such as a square or a rectangle, the center C1 of the mounting region refers to a center point of the mounting region at which diagonal lines of the quadrilateral intersect each other and directly onto which the center of the light emitting element is projected. Suppose that a light emitting element includes semiconductor layers laminated on a light transmissive substrate and is flip-chip mounted with the light transmissive substrate facing upward. In the case of using such a light emitting element, a distance between an active layer of the light emitting element and an upper surface of the substrate becomes extremely small. Because of this, the center of the mounting region on the substrate can also be considered to be aligned with the center of the active layer in the light emitting element.

In the light emitting device 100 of the first embodiment, the outer shape of the part of the encapsulant located within the range of elevation angles of 10° to 50° from the center C1 of the mounting region at the upper surface of the base 101 is preferably the curved surface at which a ratio ($r/W_{max}$) of a radius of curvature r of the curved surface with respect to the longest width $W_{max}$ of the encapsulant is in a range of 0.25 to 0.50. Further, the outer shape of the part of the encapsulant is more preferably the curved surface at which the ratio of the radius of curvature of the curved surface with respect to the longest width $W_{max}$ of the encapsulant is in a range of 0.30 to 0.45. With the curved surface specified in this way, most of light emitted from the lateral surfaces of the light emitting element 105 can travel out from the curved surface with a wide distribution angle. As shown in FIG. 1, the outer shape of a part of the encapsulant within a range of elevation angles exceeding 50° from the center C1 of the mounting region may be a substantially flat surface, for example, a curved surface with a larger radius of curvature than the curved surface within the range of elevation angles of 10° to 50°. The outer shape of the part of the encapsulant within the range of elevation angles exceeding 50° from the center C1 of the mounting region may have, for example, a recess around the central axis thereof. In this way, the height of the encapsulant is reduced, whereby the light emitting device can be thinned. The surface of the encapsulant 110 may be a smooth concave curved surface whose surface orientation continuously changes, or otherwise may have a part where the surface orientation discontinuously changes in a position at an elevation angle of more than 50°. The surface of the encapsulant 110 may have, for example, a corner bent between the curved surface of a part located within a range of elevation angles of 50° or less and the flat surface of a part located within a range of elevation angles of more than 50°.

In the light emitting device 100 of the first embodiment, when viewing the lateral surface of the encapsulant 110 from the direction parallel to the upper surface of the base 101, the ratio ($W_{max}$/Lw) of the longest width $W_{max}$ of the encapsulant 110 with respect to the longest width (Lw) of the light emitting element is preferably 2 or more. The ratio ($W_{max}$/Lw) of the longest width $W_{max}$ of the encapsulant 110 with respect to the longest width (Lw) of the light emitting element is more preferably in a range of 3 to 6. By setting the ratio ($W_{max}$/Lw) of the longest width $W_{max}$ of the encapsulant 110 with respect to the longest width (Lw) of the light emitting element within the above-described range, most of light emitted from the lateral surfaces of the light emitting element 105 can travel out from the curved surface with wide light distribution angle. Here, the longest width Lw of the light emitting element refers to, for example, a length of a diagonal line when the planar shape of the light emitting element as viewed from the top is quadrilateral, such as a square shape or a rectangular shape.

That is, in the light emitting device 100 of the first embodiment, the light reflective film 107 is provided at a light emitting surface of the light emitting element 105 to allow light to emit from the lateral surfaces of the light emitting element 105, thus achieving the batwing light distribution characteristics. The light from the lateral surfaces of the light emitting element 105 is emitted while spreading from the respective lateral surfaces thereof. Because of this, if the outer surface of the encapsulant 110 is located near the lateral surface of the light emitting element 105, much of light emitted from the lateral surfaces of the light emitting element 105 travels out from the lower end of the outer surface of the encapsulant 110 in an unbalanced manner. Consequently, at the outer surface of the encapsulant, the light cannot effectively travel out from the curved surface provided within the range of elevation angles of 10° to 50° from the center C1 of the mounting region. Meanwhile, if the outer surface of the encapsulant 110 is too far from the lateral surface of the light emitting element 105, light loss becomes significant when the light passes through the encapsulant 110, thus failing to enhance the light extraction efficiency. Accordingly, the ratio ($W_{max}$/Lw) of the longest width $W_{max}$ of the encapsulant 110 with respect to the longest width (Lw) of the light emitting element is preferably set within the above-described range.

The light emitting device 100 with the above configuration according to the first embodiment is configured on the basis of: the light distribution characteristics of the light emitting element 105 when the light reflective film 107 is provided; the outer shape of the light emitting element 105, and the outer shape of the encapsulant 110 on the substrate as viewed from the top; and the like. Accordingly, the ratio (r/$W_{max}$) of the radius of curvature r of the curved surface with respect to the longest width $W_{max}$ of the encapsulant is set within the above-described range as appropriate, thereby enabling achievement of the desired light distribution characteristics required for the light emitting device.

Preferred forms of the light emitting device 100 according to the present embodiment will be described below.

Base 101

The base 101 is a member on which the light emitting element 105 is mounted. The base 101 includes the conductive wirings 102 on its surface to supply electric power to the light emitting element 105.

Examples of a material for the base 101 include ceramics, and resins, such as phenol resin, epoxy resin, polyimide resin, BT resin, polyphthalamide (PPA), polyethylene telephthalate (PET), and polyethylene naphthalate (PEN). Among these, resin is preferably selected as the material in terms of low cost and formability. The thickness of the base can be selected as appropriate. The base may be either a rigid substrate or a flexible substrate manufacturable by a roll-to-roll system. The rigid substrate may be a thinned rigid substrate that is bendable.

To obtain the light emitting device with good resistance to heat and light, ceramics are preferably selected as the material for the base 101. Examples of ceramics include alumina, mullite, forsterite, glass-ceramics, nitride-based (e.g., AlN) ceramics, and carbide-based (e.g., SiC) ceramics. Among these, ceramics made of alumina or containing alumina as a principal component are preferable.

In the use of resin as the material for forming the base 101, an inorganic filler, such as glass fiber, $SiO_2$, $TiO_2$, or $Al_2O_3$, can be mixed into the resin, thereby enabling improvement of the mechanical strength of the base, reduction of the thermal expansion rate thereof, improvement of the light reflectance thereof, and the like. The base 101 may be other member as long as it can separate and insulate a pair of conductive wirings 102 from each other. The base 101 may employ a so-called metal substrate which includes a metal member with an insulating layer formed therein.

Conductive Wiring 102

The conductive wirings 102 are members electrically connected to electrodes of the light emitting element 105 and adapted to supply current (i.e., power) from the outside to the light emitting element. That is, the conductive wiring serves as an electrode or a part thereof for passing current from the outside. Normally, the conductive wirings are formed of at least two positive and negative wirings spaced apart from each other.

Each conductive wiring 102 is formed on at least an upper surface of the base, which serves as a mounting surface for the light emitting element 105. Material for the conductive wiring 102 can be selected as appropriate, depending on material used for the base 101, a manufacturing method thereof, and the like. For example, when ceramic is used as the material for the base 101, the conductive wirings 102 is preferably made of material having a high melting point that can withstand the sintering temperature of a ceramic sheet. Specifically, a metal with a high melting point, such as tungsten or molybdenum, is preferably used as the material for the conductive wiring. Further, other metal materials, such as nickel, gold, or silver, may be formed to cover the above-described surface of the conductive wiring by plating, sputtering, vapor deposition, etc.

When glass epoxy resin is used as the material for the base 101, the material for the conductive wiring 102 is preferably made of material that is easy to process. In the case of using an epoxy resin injection-molded as the material for the base, the conductive wiring 102 is preferably made of material that can be easily processed by punching, etching, bending, etc., and has a relatively high mechanical strength. Specifically, examples of the conductive wiring include metals, such as copper, aluminum, gold, silver, tungsten, iron, and nickel, and a metal layer or lead frame configured with an iron-nickel alloy, phosphor bronze, an iron-copper alloy, molybdenum, and the like. The surface of the lead frame may be coated with a metal material other than the material of a lead frame main body. This material can be appropriately selected, and may be, for example, silver alone, which has a high reflectance for the light from the light emitting element, or an alloy of silver and copper, gold, aluminum, or rhodium. Alternatively, the conductive wiring can be formed of multiple layers using silver or each alloy. Suitable methods for coating with a metal material can include sputtering, and vapor deposition, as well as the plating.

Bonding Member 103

The bonding members 103 are members for fixing the light emitting element 105 onto the base 101 or conductive wirings 102. In the flip-chip mounting, conductive members are used as the bonding member in the same manner as in this embodiment. Specifically, suitable materials for the bonding member can include a Au-containing alloy, a Ag-containing alloy, a Pd-containing alloy, an In-containing alloy, a Pb—Pd containing alloy, a Au—Ga containing alloy, a Au—Sn containing alloy, a Sn-containing alloy, a Sn—Cu containing alloy, a Sn—Cu—Ag containing alloy, a Au—Ge containing alloy, a Au—Si containing alloy, an Al-containing alloy, a Cu—In containing alloy, and a mixture of metal and a flux.

Suitable forms of the bonding member 103 can include a liquid-type, a paste-type, and a solid-type (e.g., sheet-shaped, block-shaped, powder-shaped, or wiring-shaped). The form of the bonding member can be selected based on the composition thereof, the shape of the base, and the like as appropriate. These bonding members 103 may be formed of a single member or a combination of several kinds of members.

Insulating Member

The conductive wirings 102 are preferably covered with the insulating member except for parts thereof electrically connected to the light emitting element 105 and other materials. That is, as shown in FIG. 1, a resist for insulating and covering the conductive wirings 102 may be disposed over the base. The insulating member can function as such a resist.

In the case of disposing the insulating member, the conductive wirings 102 are insulated by the insulating member. In addition, the insulating member can contain the white-based filler to reduce leakage and absorption of light, thereby enabling improvement of the light extraction efficiency of the light emitting device 100.

Material for the insulating member can be appropriately selected on the basis that the material is less likely to absorb the light from the light emitting element and has an insulating property. Examples of the material for the insulating member can include epoxy, silicone, modified silicone, urethane, oxetane, acrylic, polycarbonate, and polyimide resins.

Light Emitting Element 105

The light emitting element 105 mounted on the base can be one known in the art. In this embodiment, a light emitting diode is preferably used as the light emitting element 105.

The light emitting element 105 that emits light having an arbitrary wavelength can be selected. For example, a blue or green light emitting element can employ a nitride-based semiconductor ($In_xAl_yGa_{1-x-y}N$, $0 \leq X$, $0 \leq Y$, $X+Y \leq 1$). A light transmissive sapphire substrate and the like can be used as a growth substrate. A red light emitting element can use GaAlAs, AlInGaP, etc. Moreover, a semiconductor light emitting element configured with any material other than the materials described above can also be used. The composition, emission color, and size of the light emitting element for use, and the number of light emitting elements, and the like can be selected as appropriate in accordance with the purpose.

Various emission wavelengths of the light emitting element can be selected depending on the material of the semiconductor layer and a mixed crystal ratio thereof. The light emitting element may include positive and negative electrodes on the same surface side to enable the flip-chip mounting, or may alternatively have positive and negative electrodes on its difference surfaces.

The light emitting element 105 in this embodiment includes a light transmissive substrate, and a semiconductor layer stacked on the substrate. The semiconductor layer includes an n-type semiconductor layer, an active layer, and a p-type semiconductor layer formed in this order. An n-type electrode is formed at the n-type semiconductor layer, and a p-type electrode is formed at a p-type semiconductor layer.

As shown in FIG. 1, the light emitting element 105 is flip-chip mounted on the conductive wirings 102 arranged on the surface of the base 101 via the bonding members 103. The light emitting element 105 has the electrode-formed surface and a surface opposite thereto. The surface opposite the electrode-formed surface—that is, a main surface of the light transmissive substrate—would serve as a light extraction surface. However, in this embodiment, the light reflective film 107 is formed at the light extraction surface, and thus the lateral surfaces of the light emitting element 105 practically serve as the light extraction surface. That is, part of the light emitted from the light emitting element 105 and directed toward the main surface of the light emitting element 105 is returned to the light emitting element 105 by the light reflective film 107, then repeatedly reflected inside the light emitting element 105, and eventually emitted from the lateral surfaces of the light emitting element 105. Therefore, the light distribution characteristics of the light emitting device 100 are the characteristics of a combination of the light passing through the light reflective film 107 and the light emitted from the lateral surfaces of the light emitting element 105.

The light emitting element 105 is disposed to straddle a region between the two conductive wirings 102 that are isolated and insulated on positive and negative sides. The light emitting element 105 is electrically connected and mechanically fixed to the conductive wirings via the conductive bonding members 103. Examples of methods for mounting the light emitting element 105 include a mounting method using bumps, as well as a mounting method using a solder paste. As the light emitting element 105, a small-sized package product which incorporates the light emitting element encapsulated with a resin or the like can also be used. The shape or structure of the light emitting element 105 is not specifically limited, and can be appropriately selected.

While the forgoing is an example of a mounting method by flip-chip manner, certain embodiments of the present invention may employ a mounting structure in which an insulating substrate side of a light emitting element is the mounting surface, and electrodes formed on the upper surface of the light emitting element are connected to wires. In this case, the upper surface of the light emitting element is positioned at an electrode-formed surface side, while the light reflective film is positioned at the electrode-formed surface side.

Light Reflective Film 107

The light reflective film 107 is formed on the light extraction surface of the light emitting element 105. Material for the light reflective film 107 may be one which at least reflects light emitted from the light emitting element 105, for example, metal or resin containing a white filler.

A dielectric multilayer film can be used as the light reflective film 107 to produce the light reflective film with less light absorption.

Materials for the dielectric multilayer film can be a metal oxide film material, a metal nitride film, an oxynitride film, or the like. Organic materials, such as silicone resin or fluorine resin, can also be used. However, the material for the dielectric multilayer film can be selected from ones other than those described above.

Figure 2:
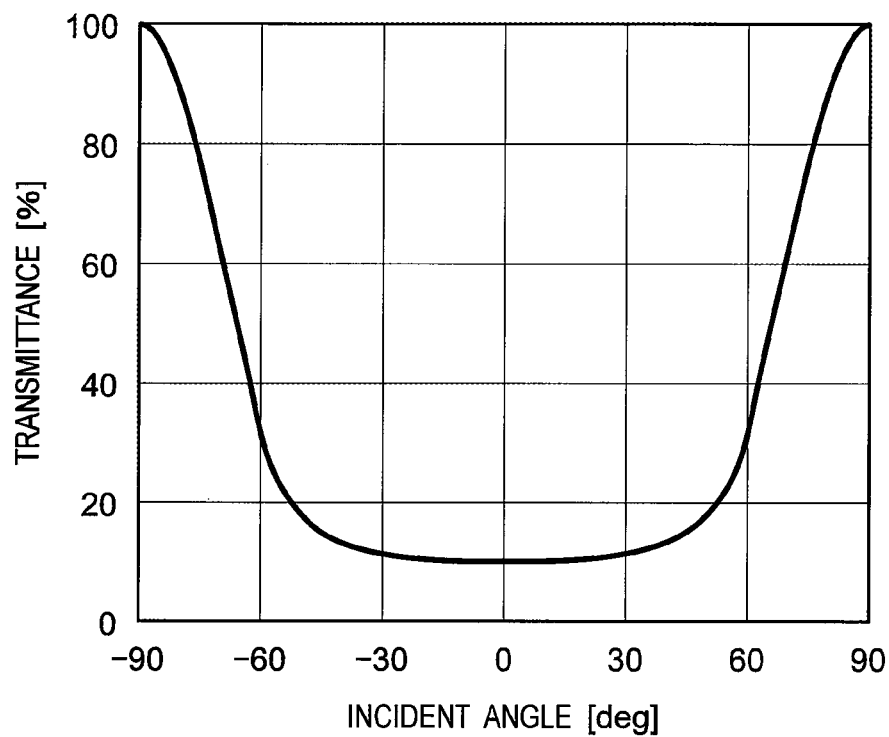
FIG. 2 is a graph showing a transmittance rate of a dielectric multilayer film relative to an incident angle of incident light.

As shown in FIG. 2, the dielectric multilayer film has reflection characteristics: depending on an incident angle of light in the reflective range in which the reflectance of the perpendicularly incident light on the dielectric multilayer film is high; and as an absolute value of the incident angle becomes greater, the light transmittance rate becomes higher. Therefore, in the light emitting device of the first embodiment, when the dielectric multilayer film is used as the light reflective film 107, light from the upper surface of the light reflective film 107 at a large angle relative to the optical axis is emitted in addition to the light emitted from the lateral surfaces of the light emitting element 105, thereby enabling emission of stronger light laterally from the light emitting device 100. This can achieve the batwing light distribution characteristics in which the ratio of the light emitted laterally from the light emitting device 100 with respect to the whole of emitted light is higher (i.e., more significant), compared to the light emitted therefrom vertically. The term "optical axis" as used herein means an axis vertical to the light emitting surface of the light emitting element 105. The dielectric multilayer film can adjust its reflection characteristics (specifically, the reflectance of perpendicularly incident light thereon, the dependence of the reflectance on an incident angle, and the like) by changing the materials or the number of dielectric film layer alternately laminated, or the like. Therefore, in the light emitting device of the first embodiment, when the dielectric multilayer film is used as the light reflective film 107, the reflection characteristics of the dielectric multilayer film can be designed according to the light distribution characteristics demanded for the light emitting device, thereby making it possible to easily achieve the desired light distribution characteristics.

A reflection wavelength range of the light reflective film 107 for the perpendicularly incident light thereon, especially, when the dielectric multilayer film is used as the light reflective film 107, preferably includes an emission peak wavelength of the light emitting element 105. Further, in the reflection wavelength range, a region on the longer wavelength side than the emission peak wavelength is preferably set wider, compared to a region on the shorter wavelength side than the emission peak wavelength. This is because as the angle from the optical axis of the incident light is increased, the reflection wavelength range of the dielectric multilayer film is shifted to the shorter wavelength side. By widening the region of the reflection wavelength range on the longer wavelength side with respect to the emission peak wavelength, the high reflectance can be maintained even for light incident at a large angle relative to the optical axis.

Encapsulant 110

As materials for the encapsulant 110, light transmissive materials, including epoxy resin, silicone resin, a mixed resin thereof, or glass. Among these, silicone resin is preferably selected by taking into consideration the light resistance and the formability.

The encapsulant 110 can also contain a colorant as well as a light diffusing material.

In the case of adding these materials to the encapsulant 110, it is preferable to use ones less likely to affect the light distribution characteristics. For example, the contained material having a particle size of 0.2 µm or less is preferable because it is less likely to affect the light distribution characteristics. The term "particle size" as used herein refers to a median diameter, and can be measured, for example, by a laser diffraction particle size distribution measuring apparatus (product name: Mastersizer 3000, manufactured by Malvern Instruments Ltd.).

The encapsulant 110 can be formed by compression molding or injection molding to cover the light emitting element 105. Alternatively, the material for the encapsulant 110 has its viscosity optimized to be dropped or drawn on the light emitting element 105, thereby making it possible to control the shape of the encapsulant 110 by the surface tension of the material itself.

In the latter formation method, a mold is not required, so that the encapsulant can be formed by a simpler method. Besides adjusting the inherent viscosity of the material, the viscosity of the material of the encapsulant can be adjusted by using the above-described light diffusion material, wavelength conversion material, and colorant to form the encapsulant with a desired viscosity by the formation method.

Figure 3:
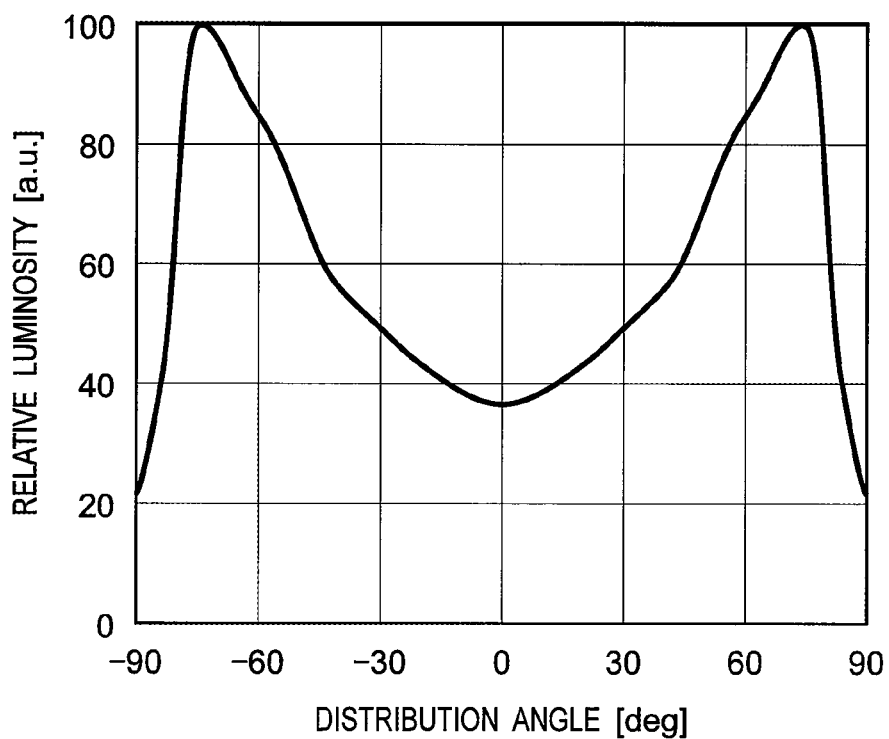
FIG. 3 is a graph showing an example of light distribution characteristics of the light emitting device according to the first embodiment.

According to the first embodiment described above, it is possible to provide the light emitting device with wide light distribution which exhibits the light distribution characteristics shown in FIG. 3.

The light distribution characteristics shown in FIG. 3 are those of the light emitting device with the structure described below.

A light emitting element was used that had an emission wavelength of 450 nm and a size of 0.6 mm×0.6 mm×0.15 mm (height).

As the light reflective film, a dielectric multilayer film was used which includes a lamination of 5.5 pairs, each pair including a first dielectric film having a thickness of 46.56 nm and made of $Nb_2O_5$ and a second dielectric film having a thickness of 75.57 nm and made of $SiO_2$.

The encapsulant was formed to have the following outer shape by using a silicone resin with a refractive index of 1.5:
 (1) shape in the top view: substantially circular
 (2) diameter of bottom surface: 3.23 mm
 (3) height: 0.94 mm
 (4) radius of curvature of a curved surface located within a range of elevation angles of 0° to 50° from the center of the mounting region: 1.21 mm In the light emitting device used for measurement of the light distribution characteristics shown in FIG. 3, the outer shape of the encapsulant had a recess around the central axis (in a region located within a range of elevation angles of 50° or more from the center of the mounting region).

Second Embodiment

Figure 4:
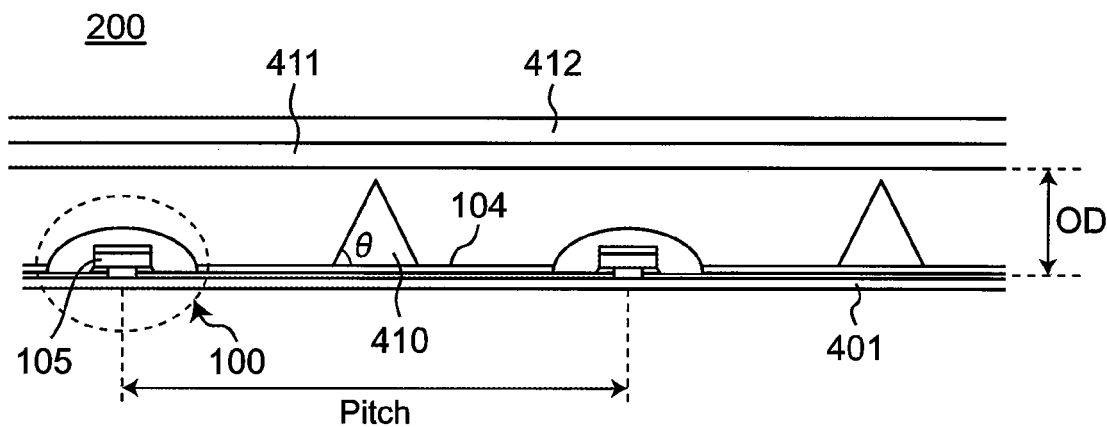
FIG. 4 is a cross-sectional view of a light emitting module 200 according to a second embodiment.

FIG. 4 is a cross-sectional view of a light emitting module 200 according to a second embodiment.

The light emitting module 200 of the second embodiment is an integrated light emitting device that includes a plurality of the light emitting devices 100 provided on the base 401, each light emitting device being configured in the same manner as in the first embodiment, and light reflective members 410 disposed between the respective light emitting devices 100. A light diffusion plate 411 for diffusing the light from the light emitting elements 105 and a phosphor plate 412 are disposed on the light extraction surface side above the light emitting devices 100 and the light reflective members 410 so as to be substantially in parallel with the upper surfaces of the light emitting elements 105. The phosphor plate 412 is a wavelength conversion member that absorbs at least part of the light emitted from the light emitting device 100 and converts the absorbed light into light with a different wavelength.

In general, in a conventional integrated light emitting device, as the ratio of a distance between the base and the light diffusion plate (hereinafter referred to as an optical distance: OD) relative to a distance between the adjacent light emitting elements (hereinafter referred to as a Pitch) is decreased, the amount of light between the light emitting elements 105 on the surface of the light diffusion plate 411 becomes less, causing a dark area.

However, the light emitting module 200 according to the second embodiment includes the plurality of light emitting devices 100 exhibiting the batwing light distribution characteristics with the wide light distribution and the light reflective member 410 disposed between the adjacent light emitting devices 100. This can supplement amount of light in portions between the light emitting devices 100 with light reflected by the light diffuser 411, thereby luminance non-uniformity on the surface of the light diffuser 411 is reduced even in the case of a smaller a value OD divided by Pitch (also referred to as "OD/pitch").

In the light emitting module 200 of the second embodiment, a light reflective surface of the light reflective member 410 is inclined with respect to the base 401, and its inclination angle θ is set by considering the light distribution characteristics of the respective light emitting devices 100 so as to reduce the luminance non-uniformity on the surface of the light diffusion plate 411. In order to reduce the luminance non-uniformity on the surface of the light diffusion plate 411 and to achieve the thinned light emitting module 200, the plurality of light emitting devices 100 preferably has the light distribution characteristics in which the amount of light becomes large in a region where an angle formed by the optical axis is large. The optical axis is specified by the direction perpendicular to the light emitting surface of the light emitting element.

For example, when a value OD divided by Pitch (also referred to as "OD/Pitch") is 0.2 or less, an elevation angle of light incident on the light reflective member 410 with respect to the light emitting surface of the light emitting element 105 as the reference becomes less than 22°. Thus, for the low OD/Pitch of 0.2 or less, in order to increase the light reflectivity of the light reflective member 410, the light distribution characteristics of the light emitting devices 100 preferably have the feature that the amount of light within a range of elevation angles of less than 20° relative to the upper surface of the base is large. Specifically, first and second peaks of the emission intensity are preferably positioned in the range of elevation angles of less than 20° relative to the upper surface of the base is large. In other words, the light distribution characteristics of the light emitting device 100 preferably show that when a light distribution angle in the vertical direction relative to the base 401 is defined as 90°, the first peak within a range of light distribution angles of 0° to 90° is located at a light distribution angle of less than 20°, while the second peak within a range of light distribution angles of 90° to 180° is located at a light distribution angle of more than 160°. The amount of light within the range of elevation angles of less than 20° is preferably 30% or more of the whole amount of light, and more preferably 40% or more thereof.

Light Reflective Member 410

The light reflective member 410 is disposed between the adjacent light emitting devices 100 as described above.

Material for the light reflective member may be one which at least reflects the light emitted from the light emitting device 100. For example, a metal plate or resin containing a white filler can be suitably used for the light reflective member.

Further, a dielectric multilayer film can be used as a reflective surface of the light reflective member to form the reflective surface with less light absorption. In addition, the reflectance of the light reflective member can be suitably adjusted by designing the dielectric multilayer film, or its reflectance can be controlled depending on the angle of the light.

The height of the light reflective member 410 and the inclination angle θ of the light reflective surface thereof relative to the surface of the base 401 can bean appropriately selected values. Furthermore, the reflective surface may be a planar surface or a curved surface. The optimal inclination angle θ and shape of the reflective surface can be set in order to mitigate the luminance non-uniformity on the surface of the light diffusion plate 411, The height of the light reflective member 410 is preferably set at a maximum of 0.3 times the distance between the adjacent light emitting elements, and for example, more preferably a maximum of 0.2 times the distance between the adjacent light emitting elements. This configuration can provide the thinned light emitting module 200 with reduced luminance non-uniformity.

When the light emitting module 200 is used in an environment where an operating temperature tends to change significantly, the linear expansion coefficients of the light reflective member 410 and the base are preferably close to each other. If the linear expansion coefficients of the light reflective member 410 and the base 401 significantly differ from each other, warpage could occur in the light emitting module 200 due to a change in temperature, or otherwise the positional relationship between the components, especially, between the light emitting device 100 and the light reflective member 410 would deviate, thus failing to obtain the desired optical properties. In order to inhibit or prevent the warpage of the entire light emitting module 200 even when the linear expansion coefficients of the light reflective member and the base are different to each other, the light reflective member 410 may be preferably formed by a film molded product that is configured with an elastically deformable bent film. When the light reflective member 410 is formed from the film molded product, the deformation due to the difference in the thermal expansion coefficient can be absorbed while sharing the deformation at several portions thereof, thus inhibiting or preventing the warpage of the entire light emitting module 200.

Figure 5A:
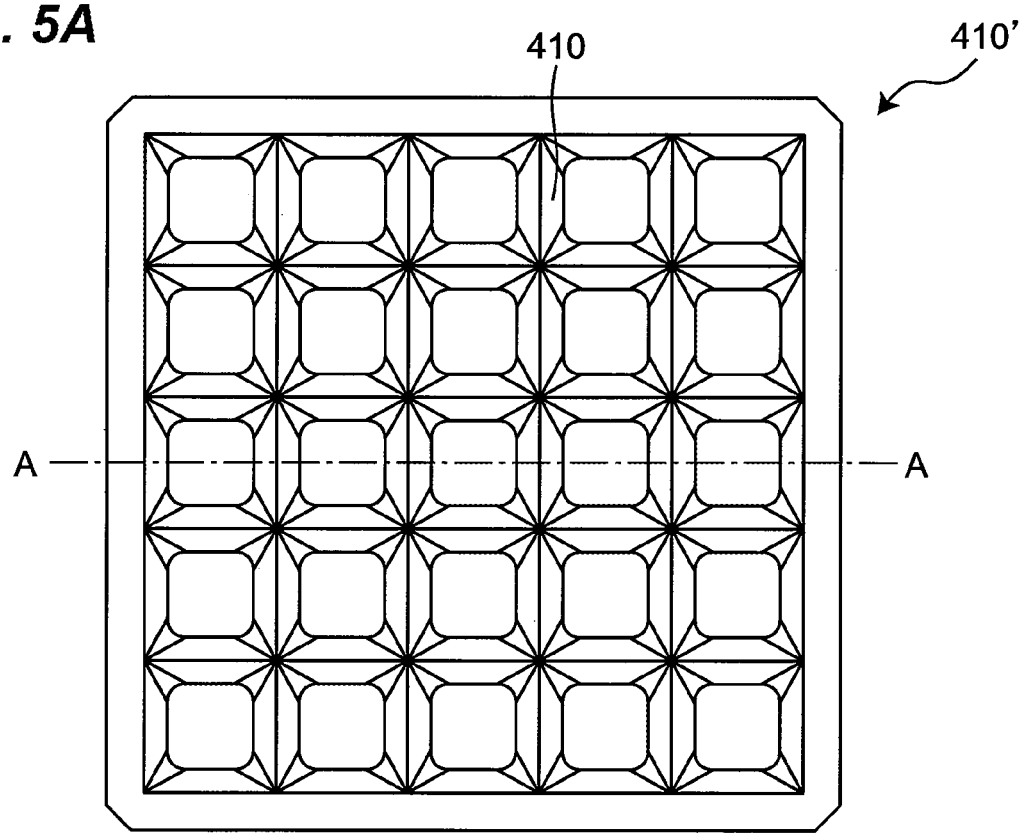
FIG. 5A is a top view of a plate-shaped member 410' which is usable in the light emitting module 200 according to the second embodiment.
Figure 5B:
FIG. 5B is a cross-sectional view taken along the line A-A in FIG. 5A.

As shown in FIGS. 5A and 5B, the respective light reflective members 410 can be the plurality of light reflective members 410 may be integrally formed into one plate-shaped member 410', but not molded or fabricated individually. FIG. 5A is a top view of the plate-shaped member 410', and FIG. 5B is a cross-sectional view taken along the line A-A of FIG. 5A. The plate-shaped member 410' has a plurality of through holes 413, corresponding to the positions, for example, where the respective light emitting devices 100 are to be mounted. The light reflective members 410 are disposed around the through holes 413. Thus, when the plate-shaped member 410' is disposed on the base 401, the light reflective surface with an inclination angle θ relative to the surface of the base 401 is formed around each through hole 413. The light emitting devices 100 may be mounted within the through holes 413 after the plate-shaped member 410' is bonded onto the base 401. Alternatively, after the light emitting devices 100 are mounted at predetermined positions on the base 401, the plate-shaped member 410' may be bonded onto the base 401 such that each light emitting device 100 is positioned within the corresponding through hole 413.

The plate-shaped member 410' can be formed by die molding, vacuum forming, pressure forming, press molding, and the like. Instead of the plate-shaped member 410', the light reflective members 410 may be formed by a method which involves drawing a light reflective resin directly on the base 401. The height of the light reflective member 410 is preferably set at 0.3 times the distance between the adjacent light emitting elements or less, and for example, more preferably 0.2 times the distance (i.e., pitch) between the adjacent light emitting elements or less.

The light emitting module 200 with the above-described configuration according to the second embodiment includes the plurality of light emitting devices 100 having the batwing light distribution characteristics with wide light distribution and the light reflective members 410 provided between the adjacent light emitting devices 100, thereby making it possible to produce an optical module applicable for a backlight that is thinned and reduced luminance non-uniformity.

The light emitting module 200 with the above-described configuration according to the second embodiment includes the phosphor plate 412, thereby realizing a while light emitting module. In the light emitting module 200 according to the second embodiment, instead of the phosphor plate 412, a phosphor plate or a phosphor layer as a wavelength conversion member may be provided between the light emitting element 105 and the encapsulant 110 in each light emitting device 100, for example, so as to be in contact with the light emitting surface of the light emitting element 105. In this way, a white light emitting module can be achieved.

The light emitting device and light emitting module of the present disclosure can be used as light sources for liquid crystal display backlight, various lighting devices, and the like.

What is claimed is:

1. A light emitting device comprising:
a base comprising a conductive wiring;
a light emitting element mounted on the base, and including an active layer adapted to emit a first light;
a light reflective film located on and in direct contact with an upper surface of the light emitting element; and
an encapsulant covering the light emitting element and the light reflective film,
wherein a ratio of a maximum width ($W_{max}$) of the encapsulant with respect to a maximum width of the light emitting element, in a side view, is 2 or more,
wherein an outer shape of a part of the encapsulant located within a range of elevation angles that is in a range of 10° to 50° from a center of a mounting region at an upper surface of the base on which the light emitting element is mounted is formed to have a curved surface,
wherein an outer shape of the encapsulant in a range of elevation angles exceeding 50° from the center of the mounting region is (i) a curved surface with a larger radius of curvature than the curved surface in the range of elevation angles of 10° to 50°, or (ii) a substantially flat surface, and
wherein a ratio ($r/W_{max}$) of a radius of curvature (r) of the curved surface with respect to the maximum width ($W_{max}$) of the encapsulant, in a side view, is in a range of 0.30 to 0.45.

2. The light emitting device according to claim 1, wherein a surface of the encapsulant is a concave curved surface.

3. The light emitting device according to claim 1, wherein the light reflective film is configured such that a light transmission rate of the light reflective film with respect to the first light depends on an incident angle of the first light.

4. The light emitting device according to claim 1, wherein the light reflective film is configured such that a light transmission rate of the light reflective film with respect to the first light become higher as an absolute value of an incident angle become greater.

5. The light emitting device according to claim 4, wherein the light reflective film comprises a dielectric multilayer film.

6. The light emitting device according to claim 1, wherein the light reflective film comprises a dielectric multilayer film.

7. The light emitting device according to claim 1,
wherein a reflection wavelength range of the light reflective film with respect to a perpendicularly incident light includes an emission peak wavelength of the light emitting element, and
wherein a region of the reflection wavelength range on a longer wavelength side of the emission peak wavelength is wider than a region of the reflection wavelength range on a shorter wavelength side of the emission peak wavelength.

8. The light emitting device according to claim 1, wherein an amount of light emitted within a range of elevation angles of less than 20° is 30% or more of a whole amount of light emitted from the light emitting device.

9. The light emitting device according to claim 1, wherein an amount of light emitted within a range of elevation angles of less than 20° is 40% or more of a whole amount of light emitted from the light emitting device.

10. The light emitting device according to claim 1, wherein the ratio of the maximum width ($W_{max}$) of the encapsulant with respect to the maximum width of the light emitting element, in a side view, is in a range from 3 to 6.

11. The light emitting device according to claim 1, wherein a ratio ($H/W_{min}$) of a height (H) of the encapsulant with respect to a minimum width ($W_{min}$) of the encapsulant, in a side view, is less than 0.5.

12. The light emitting device according to claim 1, wherein a ratio ($H/W_{min}$) of a height (H) of the encapsulant with respect to a minimum width ($W_{min}$) of the encapsulant, in a side view, is less than 0.3.

13. The light emitting device according to claim 1, wherein the light emitting element is flip-chip mounted.

14. The light emitting device according to claim 1, wherein the outer shape of the encapsulant in the range of elevation angles exceeding 50° from the center of the mounting region is the curved surface with the larger radius of curvature than the curved surface in the range of elevation angles of 10° to 50°.

15. The light emitting device according to claim 1, wherein the outer shape of the encapsulant in the range of elevation angles exceeding 50° from the center of the mounting region is the substantially flat surface.

16. The light emitting device according to claim 1, wherein the light emitting element is the only light emitting element that is covered by the encapsulant.

* * * * *